SHARP RISE AND FALL TIME PULSE GENERATOR EMPLOYING TWO SEQUENTIALLY GATED AVALANCHE TRANSISTORS
Filed Jan. 17, 1964 2 Sheets-Sheet 1

INVENTOR.
BRIAN H. BELL
BY
Curtis, Morris & Safford
ATTORNEYS

Feb. 7, 1967 B. H. BELL 3,303,356

SHARP RISE AND FALL TIME PULSE GENERATOR EMPLOYING TWO SEQUENTIALLY GATED AVALANCHE TRANSISTORS

Filed Jan. 17, 1964 2 Sheets-Sheet 2

INVENTOR.
BRIAN H. BELL
BY
Curtis, Morris & Safford
ATTORNEYS

United States Patent Office 3,303,356

Patented Feb. 7, 1967

3,303,356

SHARP RISE AND FALL TIME PULSE GENERATOR EMPLOYING TWO SEQUENTIALLY GATED AVALANCHE TRANSISTORS

Brian H. Bell, Bethel, Conn., assignor to National Semiconductor Corporation, Danbury, Conn.

Filed Jan. 17, 1964, Ser. No. 338,498
7 Claims. (Cl. 307—88.5)

This invention relates to electrical switching circuits and signal generators; more particularly, this invention relates to electrical switching circuits and pulse generators utilizing "negative resistance" semiconductor devices in the production of electrical pulses.

The "negative resistance" semiconductor devices used in signal generators and switching circuits of the present invention include such devices as silicon-controlled rectifiers, "four-layer" or "Shockley" diodes, and "avalanche" transistors. These devices are sometimes known collectively as "S-negative resistance" devices because their operational characteristic curves (with output voltage plotted horizontally versus output current on the vertical axis) look roughly like the letter S. They all have the quality that they are substantially non-conductive at applied D.C. voltages below a certain minimum level, but abruptly change so as to become conductive when the applied voltage reaches or exceeds that minimum level.

In its preferred form, the switching circuit and signal generator of the present invention uses avalanche transistors. An "avalanche transistor" is an avalanche semiconductor device having at least two semiconductor junctions. It has base, emitter and collector electrodes as in ordinary transistors. Conduction between the emitter and collector of this device exhibits an S-shaped characteristic. That is, at collector-to-emitter voltages below a voltage called the "avalanche" or "break-down" voltage, the device presents a high impedance to direct current flow between the emitter and collector. After break-down has occurred, this impedance is very low.

Avalanche transistors have the further characteristic that, after break-down, if the collector-to-emitter voltage is maintained above a certain minimum value (substantially less than break-down voltage) the transistor will be maintained in this low-impedance or "conducting" state. When this voltage falls below that minimum value, the transistor abruptly returns to its high-impedance or "non-conducting" state.

A further characteristic of the avalanche transistor (as well as other S-negative resistance semiconductor devices) is that it can be switched or "gated" into the conducting state by applying a short voltage pulse to the base electrode. Thus, this transistor can be "turned-on" conveniently by means of a short, low-energy voltage "spike."

One advantage of avalanche transistors is that they break-down or switch quickly, e.g., in one nanosecond ($10^{-9}$ or one billionth of a second) or less. In addition, these transistors are capable of conducting relatively large currents, e.g. currents having a magnitude of several amperes. Hence, avalanche transistors are useful as high-speed, high-current switching devices and in the past have been used in some pulse generators where high-speed switching is required.

In certain prior art pulse generators using avalanche transistors, a storage device such as a capacitor or a delay transmission line is used to store electrical energy to be discharged through the transistor and a load impedance to develop an electrical pulse. The storage device is connected in series with the collector and emitter of the transistor and the load impedance. A power supply charges the storage device while the avalanche transistor is in its non-conducting state. An electrical voltage pulse or "spike" is applied to the base electrode of the transistor. This spike switches the transistor into its conducting state and allows the storage device to discharge through the transistor and the load impedance to generate across the impedance an electrical voltage "step" which forms the initial portion of an output pulse. The pulse then is completed by turning the avalanche transistor "off." Various methods are used for turning the transistor off.

In the prior avalanche pulse generators using capacitors as storage devices, a method used for switching the avalanche transistor off is to allow the capacitor to discharge to a value of voltage so low that the collector-emitter voltage for the transistor will fall below the minimum value required to maintain the transistor in a conducting state. Since the value of voltage at which this turn-off occurs is relatively low, the voltage across the capacitor will decay a substantial amount before the avalanche transistor is switched off. Thus, the output pulses produced by such prior generators have undesirable wave-shapes. The tops of the pulses are shaped like the curve representing the discharge of a capacitor through a resistance. Furthermore, the value of voltage at which the avalanche transistor turns off is not stable so that it is difficult to control the width of the pulses produced.

To overcome this defect, in other prior art avalanche pulse generators delay transmission lines have been used as storage devices. The pulse wave form produced in those generators is better, but the use of such delay lines has certain disadvantages. Since the width of the pulses produced by such generators is determined by the length of the particular delay line used, it is difficult to vary this width. Moreover, in order to produce relatively wide pulses, the delay line must be very long, e.g., several hundred feet in length.

Another difficulty with prior art avalanche pulse generators is that their pulse repetition rate is low. That is, the maximum rate at which pulses can be produced by such devices is relatively low. For example, maximum repetition rates as low as 10,000 or 20,000 pulses per second are common with both capacitor-type and delay line type generators.

Accordingly, an object of the present invention is to provide signal generators using negative resistance semiconductor devices in producing electrical pulses having substantially rectangular wave shapes.

A further object of the present invention is to provide such generators using avalanche transistors in the production of rectangular electrical pulses whose width has a high degree of stability.

A still further object of the present invention is to provide such generators capable of producing such pulses without the use of delay lines or similarly disadvantageous storage means.

Another object of the present invention is to provide such pulse generators which are capable of producing pulses at a relatively high rate.

Still another object of the present invention is to provide such generators which are efficient, compact, and reliable.

The drawings and descriptions that follow describe the invention and indicate some of the ways in which it can be used. In addition, some of the other advantages provided by the invention will be pointed out.

Figure 1:
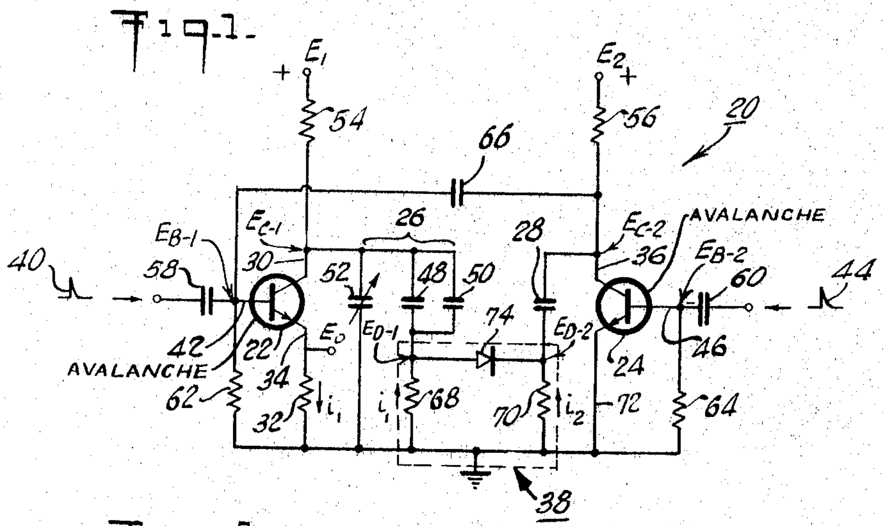
FIGURE 1 is a schematic circuit diagram of a pulse generator constructed in accordance with the present invention.

The signal generator indicated generally at 20 in FIGURE 1, includes first and second avalanche transistors 22 and 24 and first and second capacitor storage devices 26 and 28. A source of D.-C. voltage $E_1$ is connected to capacitor storage device 26 and to the collector electrode 30 of avalanche transistor 22. A load resistor 32 is connected to the emitter electrode 34 of avalanche transistor 22. Similarly, a separate source of D.-C. voltage $E_2$ is connected to capacitor 28 and to collector electrode 36 of avalanche transistor 24. The electrical output signal $E_0$ for signal generator 20 is developed across load resistor 32. A coupling network, indicated generally at 38, interconnects the avalanche transistors 22 and 24 and the associated capacitor storage devices 26 and 28.

Briefly, the operation of the signal generator 20 is as follows. A sharply-peaked voltage pulse or "spike" 40 is applied to the base electrode 42 of avalanche transistor 22. As a fixed instant of time later, another voltage spike 44 is applied to the base electrode 46 of avalanche transistor 24. The initial spike 40 turns avalanche transistor 22 on, and capacitor storage device 26 starts discharging its stored charge through transistor 22 and load resistor 32. This provides a voltage "step" across resistor 32 and initiates an output pulse. When voltage spike 44 is applied to base lead 46 of avalanche transistor 24, transistor 24 is turned on and conducts the charge supplied by capacitor 28. The coupling network 38 acts in response to this switching of avalanche transistor 24 to produce a signal which turns off transistor 22 and "bucks-out" the output voltage $E_0$ appearing across load impedance 32. This operation produces the substantially square-shaped output pulse $E_0$ shown in FIGURE 2. In this arrangement the extremely fast and high-power switching capabilities of an avalanche transistor are used both to initiate and terminate each output pulse.

Considering the generator 20 in greater detail, avalanche transistors 22 and 24 are of a commercially available type such as that designated "NS1110" and sold by National Semiconductor Corporation, Danbury, Connecticut.

Figure 2:
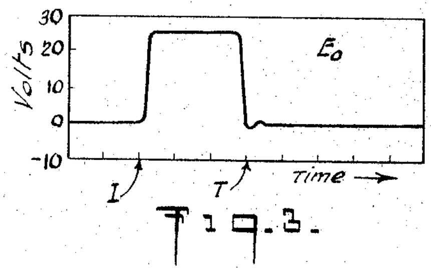
FIGURES 2 through 8 are reproductions of actual oscillographs of voltages measured during the operation of the apparatus shown in FIGURE 1.
Figure 6:
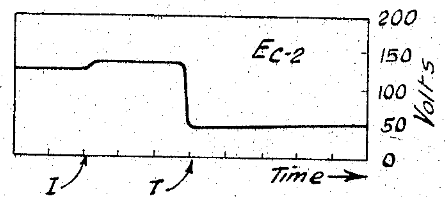
Figure 3:
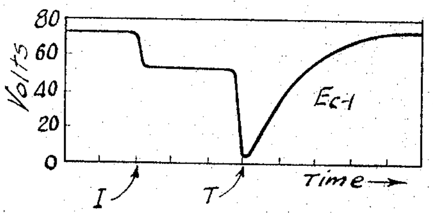
Figure 7:
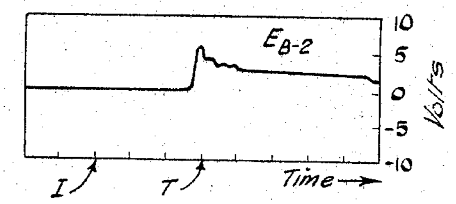
Figure 4:
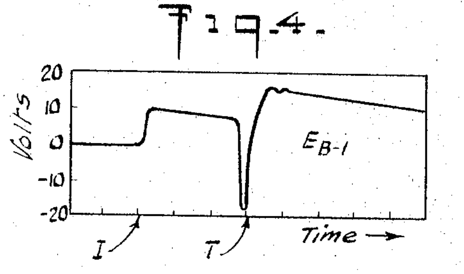
Figure 8:
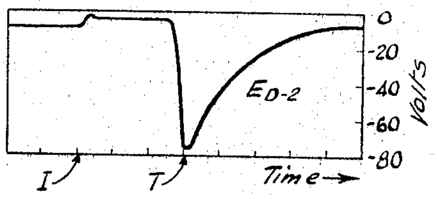
Figure 5:
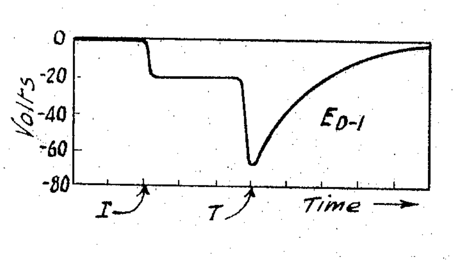

Capacitor storage device 26 consists of a relatively large capacitor 48, a relatively small capacitor 50 connected in parallel with capacitor 48, and a relatively small variable trimmer capacitor 52 connected in parallel with avalanche transistor 22 and load impedance 32. The capacitance of capacitor 48 is made relatively large so as to prevent it from discharging rapidly. Thus, it maintains the voltage applied to the collector electrode 30 of transistor 22 at a maximum during conduction of transistor 22 so as to provide an essentially flat top for the output pulse wave form, as is shown in FIGURE 2.

Small capacitor 50 is provided to tune-out the inductance of capacitor 48 and reduce transient voltages in the output pulses. Trimmer capacitance 52 is provided so as to provide a means for controlling the shape of the leading edge of the output pulses. By varying its capacitance the "sharpness" of the leading edge can be controlled; that is, the upper point of the leading edge can be made to rise above, fall below or be aligned with the flat top of the pulse. The capacitance of capacitor 28 is substantially less than that of capacitor 48.

The D.-C. voltages $E_1$ and $E_2$ are supplied through relatively large current-limiting resistors 54 and 56 in order to limit the current flowing from the power supply through the avalanche transistors when the transistors are in a conducting state.

Switching voltage spikes 40 and 44 are applied, respectively, through blocking capacitors 58 and 60. A small resistor 62 is connected between the base electrode 42 and one terminal of load resistor 32 in order to provide a D.-C. return path for direct current flowing in the base electrode lead. A similar resistor 64 also is provided for the same purpose in avalanche transistor 24.

A small capacitor 66 is connected between the collector electrode 36 of transistor 24 and the base electrode 42 of transistor 22 in order to improve the trailing edge of the output pulses. This capacitor 66 cancels the deleterious effects of the base-to-emitter capacitances of transistor 22.

Coupling network 38 consists of a resistor 68 which is connected at one end to load resistor 32 at ground, and at the other end to capacitors 48 and 50, and a resistor 70 which is connected at one end to capacitor 28 and at the other end to emitter lead 72 of transistor 24 at ground, and a diode 74. The resistance of resistor 68 is relatively low, and that of resistor 70 is relatively higher. Resistors 68 and 70 are connected directly together at ground at one end and are connected together at their opposite ends by means of diode 74. The anode of diode 74 is connected to the junction between resistor 68 and capacitor 48 and the cathode of diode 74 is connected to the junction between resistor 70 and capacitor 28.

When the pulse-initiating voltage spike 40 is applied to the base of transistor 22 at the time marked I in FIGURES 2–8, the capacitor storage device 26 discharges through transistor 22 and generates a current $i_1$ which flows through resistors 32 and 68 in the direction indicated by the arrows in FIGURE 1. The direction of this current flow through resistor 68 is such that the voltage drop $E_{D-1}$ across the resistance is negative with respect to ground. This negative voltage $E_{D-1}$ is applied to the anode of diode 74 so that the diode does not conduct. Therefore, coupling network 38 supplies no signal to avalanche transistor 24.

When, at the later instant of time T, pulse-terminating voltage spike 44 is applied to transistor 24, the discharge of capacitor 28 through transistor 24 creates a current $i_2$ flowing through resistor 70 in the direction indicated by the arrow. The resistance of resistor 70 is given a value such that the voltage drop $E_{D-2}$ across it is greater than the voltage appearing across resistor 68 so that diode 74 conducts. In addition, the resistance of resistor 70 is set to a value such that the voltage drop across it will be approximately equal to the sum of the voltages appearing across capacitors 48, 50 and 52, transistor 22, and the load resistor 32. Since the voltage across resistor 70 is opposite in polarity to all of these voltages, the latter voltages are cancelled or "bucked" out. The voltage drop across resistor 70 is developed very rapidly in response to the fast "avalanche" action of transistor 24 and the output voltage $E_0$ is reduced sharply and quickly at time T to provide a square-shaped output pulse with sharp leading and trailing edges. Since avalanche transistors are used, relatively high-current, rectangular pulses can be produced.

Avalanche transistor 24 shuts-off automatically after the voltage on capacitor 28 has decayed to a value below the cut-off level for transistor 24. Since the capacitance of capacitor 28 is fairly small, transistor 24 shuts-off shortly after transistor 22 has been shut-off.

The graphs shown in FIGURES 2 through 8 are reproductions of actual oscillographs made of various voltages occurring during the operation of the circuit shown in FIGURE 1. The circuit elements of the FIGURE 1 circuit used in producing these oscillographs had the following values:

| Name and reference numeral of component | | Value or identification of the component |
|---|---|---|
| Avalanche transistors 22 and 24 (the characteristics of these transistors are matched to within approximately 5%) | | [1] NS1110 |
| Capacitor 48 | microfarad | 0.1 |
| Capacitor 50 | picofarads | [2] 75 |
| Capacitor 52 | picofarads | 4 to 40 |
| Capacitor 28 | microfarads | .0025 |
| Capacitors 58, 60 and 66 | picofarads | 500 |
| Resistors 54 and 56 | ohms | 10,000 |
| Resistors 62 and 64 | do | 50 |
| Load resistor 32 | do | 100 |
| Resistor 68 | do | 50 |
| Resistor 70 | do | 1000 |
| Diode 74 | | [3] HP1001 |

In the oscillographs shown in FIGURES 2 through 8, the instants of time marked I and T are the same for all of the figures. As remarked above, the output pulse has a sharp-cornered, substantially square shape. Also, it can be seen from these oscillographs that at time T when transistor 24 breaks down, the voltage $E_{D-2}$ suddenly drops to a negative value which is approximately equal to the sum of the voltages across the capacitor network 26 and load resistor 32.

Figure 9:
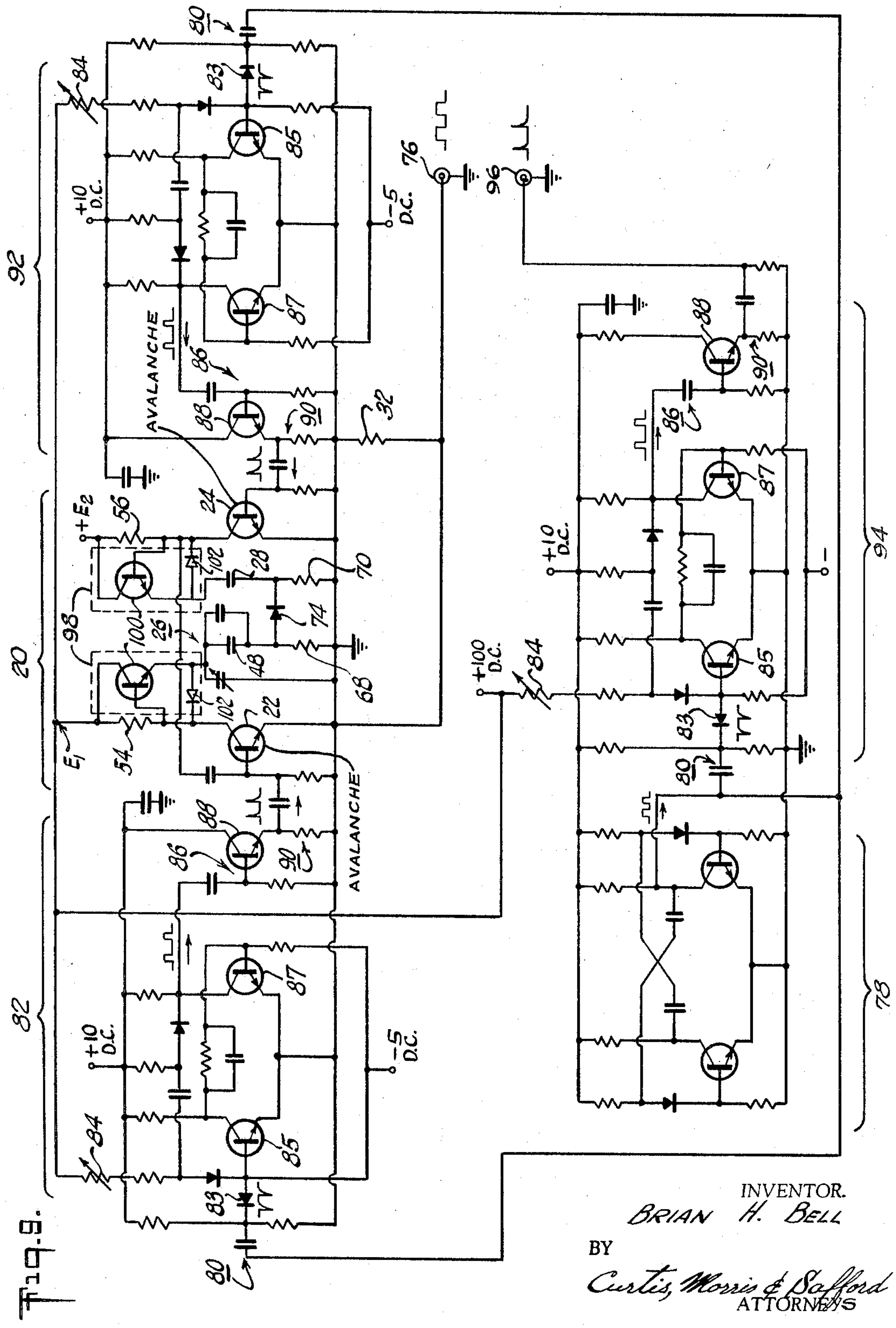
FIGURE 9 is a schematic circuit diagram of another pulse generator incorporating the apparatus of FIGURE 1 and provided with further control arrangements.

The apparatus shown in FIGURE 9 is a signal generator which is useful, for example, as a laboratory pulse generator. It includes the signal generator arrangement 20 shown in FIGURE 21 (with additional novel features to be explained below) which supplies a pulsating output signal to an output cable 76.

The initiating and terminating voltage spikes for generator 20 are developed from circuity including a well-known transistorized free-running multivibrator 78 (in the lower left-hand corner of FIGURE 9) which provides a timed square-wave output signal which is used as a reference voltage.

The output signal of multivibrator 78 is transmitted to an R–C differentiating circuit 80 which is located in the upper left-hand corner of FIGURE 9. Differentiating circuit 80 "differentiates" the square wave output of multivibrator 78 and produces positive and negative voltage spikes which are fed into a "one-shot" or mono-stable multivibrator 82 which provides the initiating voltage spike for generating circuit 20. A diode 83 blocks the positive spikes input to multivibrator 82 so that only negative spikes are passed. As is well known, in response to the receipt of such a negative voltage spike at its input, mono-stable multivibrator 82 switches from its stable condition in which one of its transistors 85 is conducting into an unstable condition in which the other transistor 87 is conducting. The multivibrator remains in that unstable condition for a pre-determined time, and then returns to its stable condition in which transistor 85 is again conducting. The output of multivibrator 82 is a train of rectangular pulses whose width may be varied by means of a potentiometer 84.

The output of multivibrator 82 is differentiated by a R–C differentiating circuit indicated generally at 86. The voltage spike output of differentiating circuit 86 is amplified by means of a transistor 88 which also blocks the flow of negative spikes. The positive spikes are again differentiated by a differentiating circuit 90 to provide amplified and precisely sharpened voltage spikes as initiating pulses for generator circuit 20.

Another one-shot or mono-stable multivibrator 92 is provided to supply terminating voltage spikes to generator circuit 20. It operates like multivibrator 82 but produces output voltage spikes occurring at a predetermined length of time after the voltage spikes produced by multivibrator 82. Adjustment of the time between the initiating and terminating pulses may be made by means of potentiometer 84 of multivibrator 92. By this means, and by varying the setting of the potentiometer 84 of multivibrator 82, the width of the output pulses of the pulse generator may be precisely and simply controlled.

A third one-shot multivibrator 94 is provided as a source of synchronizing voltage spikes to be supplied on a separate output cable 96. The operation of multivibrator 94 is like that of multivibrators 82 and 92, and the potentiometer 84 of multivibrator 94 may be adjusted to vary the positioning of the voltage spikes provided. These voltage spikes may be positioned so as to either lead or lag the output voltage pulses supplied to cable 76 so as to turn on associated electrical equipment at a desired point in the output voltage wave.

The signal generator 20 shown in FIGURE 9 differs from that shown in FIGURE 1 in that two "fast-recharge" circuits 98 are included in the FIGURE 9 arrangement. These fast-recharge circuits greatly improve the pulse repetition rate of the generator 20, and also may be used to improve the repetition rate of prior art generators which use only one S-negative resistance semiconductor device instead of the two such devices used in the generator 20.

Fast-recharge circuits 98 each consist of an ordinary medium-power transistor 100 and a diode 102. The collector leads of transistors 100 are connected, respectively, to voltage source $E_1$ or $E_2$, and the base lead of the transistor 100 is connected to the opposite terminal of current-limiting resistor 54 or 56. The emitter lead of transistor 100 is connected to capacitor storage device 26 or 28, and diode 102 is connected between the emitter of transistor 100 and the collector of avalanche transistor 22 or 24, with its anode connected to the emitter of transistor 100.

Each of these fast-recharge circuits 98 operates to amplify the current flowing into capacitors 48 and 28 while avalanche transistors 22 and 24 are in a non-conducting state. This is done by forward-biasing transistors 100 when transistors 22 and 24 are "off" so as to provide a direct, low-impedance path for current to flow from the voltage source $E_1$ or $E_2$ through the collector and emitter leads of transistor 100 to capacitor 18 or 48, thus by-passing the current-limiting resistor 54 or 56 and greatly increasing the speed at which the capacitors are charged.

Diode 102 is connected in parallel with the emitter-base junction of transistor 100 so that both diode 102 and the emitter-base junction of transistor 100 are biased by the same voltage. However, the two are connected opposite in sense to one another so that when one is forward biased the other is reverse biased, and vice-versa.

Thus, when avalanche transistors 22 and 24 are "off" the voltage at the cathode of each diode 102 is greater than the voltage at its anode, thus reverse-biasing the diode, while the emitter-base junction of transistor 100 is forward biased, thus allowing transistor 100 to conduct charging current to the capacitors.

When the avalanche transistors 22 and 24 are turned on, the capacitors 48 and 28 discharge through diodes 102 into the avalanche devices and develop output pulses as described above.

The use of the fast-recharge circuits 98 greatly improves

[1] Manufactured by National Semiconductor Corporation, Danbury, Conn.
[2] 75 micromicrofarads.
[3] Manufactured by Hewlett-Packard, Inc., Palo Alto, Calif.

the maximum pulse rate attainable in the generator 20 and in previous generators using S-negative resistance semiconductor devices. For example, repetition rates of from one to five million or more pulses per second are attainable as compared with rates in the tens or hundreds of thousands of pulses per second attainable in the usual prior art generators.

Thus, the circuit arrangement shown in FIGURE 1 gives sharp, flat-topped square wave output voltage pulses and does so without the use of delay lines or other cumbersome and power-consuming storage devices. Furthermore, since the pulse width of its output can be controlled precisely by means of a circuit arrangement such as that shown in FIGURE 9, the pulse-width is easily adjusted and yet is stable when set at a desired value. Also, a very high pulse repetition rate is attainable by use of the fast-recharge circuits shown in FIGURE 9. The resulting signal generator is compact, reliable and efficient in its operation.

The above description of the invention is intended to be illustrative and not limiting. Various changes or modifications in the embodiments described may occur to those skilled in the art and these can be made without departing from the spirit or scope of the invention as set forth in the claims.

I claim:

1. In a generator for developing a pulsating electrical output signal, first semiconductor circuit means including at least one S-negative resistance semiconductor circuit element for initiating each pulse of said pulsating output signal, and second semiconductor circuit means connected to said first semiconductor circuit means and including at least one other S-negative resistance semiconductor circuit element for terminating a pulse of said pulsating output signal, each of said S-negative semiconductor circuit elements being capable of being switched into conduction by means of an electrical gating pulse, each of said initiating and terminating circuit means including an electrical charge storage device and an impedance element, said storage device being connected so as to discharge through said S-negative circuit element and said impedance element when said S-negative element is switched into conduction, and means for interconnecting said initiating and terminating circuit means, developing an electrical signal in response to the switching into conduction of said other S-negative circuit element in said terminating circuit means, and applying said developed signal to said initiating circuit means so as to switch said one S-negative circuit element into a non-conducting state and substantially terminate a pulse of said output signal, the discharge time-constant of the electrical charge storage device and impedance element forming a part of said second semiconductor circuit means being substantially lower than the discharged time-constant of the electrical charge storage device and impedance element forming a part of said first semiconductor circuit means.

2. Apparatus as in claim 1 in which said S-negative resistance circuit elements are avalanche transistors.

3. Apparatus as in claim 4 including a current-limiting resistor connected in series with one of said S-negative resistance semiconductor circuit elements, and a fast-recharge circuit including a third semiconductor circuit element connected in parallel with said current-limiting resistor, and circuit means for interconnecting said third and S-negative circuit elements so that said third semiconductor element is in a highly conductive state when said S-negative element is in a non-conductive state, and said third element is in a non-conductive state when said S-negative element is in a highly conductive state.

4. In a generator for developing a pulsating electrical output signal, first semiconductor circuit means for initiating a pulse of said pulsating output signal, said first semiconductor circuit means including a first semiconductor circuit element normally presenting a relatively high impedance between at least one pair of its electrodes and being actuatable by means of an electrical switching pulse to change said high impedance into a relatively low impedance by avalanche operation, first means connected to said first semiconductor circuit element for storing electrical energy and discharging said stored electrical energy through said first circuit element in response to said change of impedance in said first circuit element, a first load impedance connected to said first circuit element so as to receive said stored electrical energy discharged from said first storage means and develop said output signal, second semiconductor circuit means connected to said first semiconductor circuit means for terminating said pulse of said pulsating output signal, said second semiconductor circuit means including a second semiconductor circuit element normally presenting a relatively high impedance between at least one pair of its electrodes and being actuatable by means of an electrical switching pulse to change said high impedance into a relatively low impedance by avalanche operation, second means connected to said second circuit element for storing electrical energy and discharging said stored electrical energy through said second circuit element in response to said change of impedance in said second circuit element, and a second load impedance connected to said second circuit element so as to receive said stored electrical energy discharged from said second storage means, and means interconnecting said first load impedance with said second load impedance and said first semiconductor circuit means for delivering from said second load impedance an electrical signal for opposing and reducing the energy remaining in said first storage means and opposing and reducing the output signal developed by said first load impedance, and for changing said first semiconductor element from a low-impedance to a high-impedance condition the discharge time-constant of said second charge storage and load impedance means being substantially lower than the discharge time-constant of said first charge storage and impedance means.

5. Apparatus as in claim 2, in which said first circuit means includes means for supplying a first electrical gating pulse to said one avalanche transistor, and said terminating circuit means includes means for supplying a second electrical gating pulse to said other avalanche transistor at a selected time after said first gating pulse is supplied, both of said gating pulse supply means including a mono-stable multivibrator and a differentiating circuit connecting the output of said multivibrator to said avalanche transistor so as to deliver spike-shaped gating signals to said element, a free-running multivibrator for supplying timed energizing pulses at its output, and differentiating circuit means connecting said mono-stable multivibrators to the output of said free-running multivibrator.

6. An electrical signal generator comprising in combination, first and second avalanche transistors each having a gating terminal and two other terminals, a first resistor connected in series with a first capacitor with the series combination so formed being connected between said other terminals of said first transistor, a second resistor connected in series with a second capacitor forming a second series combination, a third resistor connected at one end to one of said other terminals of said second transistor, said second series combination being connected between a second one of said other terminals of said second transistor and the other end of said third resistor forming a junction therewith, said second and third resistors being connected to said first resistor and at said junction, a diode connected at one end between said second resistor and second capacitor and at the other end between said first resistor and said first capacitor, said diode being connected so as to conduct only when there appears across said second resistor a voltage having a polarity opposite to and a magnitude greater than that of the voltage appearing across said first resistor.

7. Apparatus as in claim 6 including a fourth resistor connected between the gating terminal of said second avalanche transistor and the junction between said second and third resistors.

References Cited by the Examiner

UNITED STATES PATENTS

| | | | |
|---|---|---|---|
| 3,025,411 | 3/1962 | Rumble | 307—88.5 |
| 3,047,819 | 7/1962 | Haas | 307—88.5 |
| 3,105,160 | 9/1963 | Adler | 307—88.5 |
| 3,126,489 | 3/1964 | Dill | 307—88.5 |
| 3,173,020 | 3/1965 | Seeds | 307—88.5 |
| 3,223,854 | 12/1965 | Hansen et al. | 307—88.5 |

ARTHUR GAUSS, *Primary Examiner.*

J. S. HEYMAN, *Assistant Examiner.*